(12) United States Patent
Jang

(10) Patent No.: US 9,076,797 B2
(45) Date of Patent: Jul. 7, 2015

(54) 3D MEMORY ARRAY

(71) Applicant: Winbond Electronics Corp., Taichung (TW)

(72) Inventor: Wen-Yueh Jang, Hsinchu (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/316,810

(22) Filed: Jun. 27, 2014

(65) Prior Publication Data

US 2014/0306353 A1  Oct. 16, 2014

Related U.S. Application Data

(63) Continuation of application No. 13/208,343, filed on Aug. 12, 2011, now Pat. No. 8,835,990.

(51) Int. Cl.
| | | |
|---|---|---|
| *H01L 23/535* | (2006.01) | |
| *H01L 27/115* | (2006.01) | |
| *H01L 27/105* | (2006.01) | |

(52) U.S. Cl.
CPC ........ *H01L 23/535* (2013.01); *H01L 27/11519* (2013.01); *H01L 27/11556* (2013.01); *H01L 27/11565* (2013.01); *H01L 27/11582* (2013.01); *H01L 27/1052* (2013.01)

(58) Field of Classification Search
CPC . H01L 23/535; H01L 27/105; H01L 27/1052; H01L 27/11519; H01L 27/11556; H01L 27/11565; H01L 27/11582
See application file for complete search history.

(56) References Cited

U.S. PATENT DOCUMENTS

| | | | | |
|---|---|---|---|---|
| 2007/0236979 | A1* | 10/2007 | Takashima | 365/145 |
| 2009/0141547 | A1* | 6/2009 | Jin et al. | 365/163 |
| 2009/0207681 | A1* | 8/2009 | Juengling | 365/230.03 |
| 2011/0299328 | A1* | 12/2011 | Liu | 365/163 |

FOREIGN PATENT DOCUMENTS

| | | |
|---|---|---|
| CN | 101447502 | 6/2009 |
| CN | 101952957 | 1/2011 |
| CN | 102939632 | 2/2013 |

OTHER PUBLICATIONS

"Office Action of China Counterpart Application", issued on Jul. 23, 2014, p. 1-p. 9.

\* cited by examiner

*Primary Examiner* — Minh-Loan Tran
*Assistant Examiner* — Fazli Erdem
(74) *Attorney, Agent, or Firm* — Jianq Chyun IP Office

(57) ABSTRACT

A 3-D memory is provided. Each word line layer has word lines and gaps alternately arranged along a first direction. Gaps include first group and second group of gaps alternately arranged. A first bit line layer is on word line layers and has first bit lines along a second direction. A first conductive pillar array through word line layers connects the first bit line layer and includes first conductive pillars in first group of gaps. A first memory element is between a first conductive pillar and an adjacent word line. A second bit line layer is below word line layers and has second bit lines along the second direction. A second conductive pillar array through word line layers connects the second bit line layer and includes second conductive pillars in second group of gaps. A second memory element is between a second conductive pillar and an adjacent word line.

10 Claims, 16 Drawing Sheets

3D MEMORY ARRAY

CROSS-REFERENCE TO RELATED APPLICATION

This application is a continuation application of and claims the priority benefit of a prior application Ser. No. 13/208,343, filed on Aug. 12, 2011, now pending. The entirety of each of the above-mentioned patent applications is hereby incorporated by reference herein and made a part of this specification.

BACKGROUND OF THE INVENTION

1. Field of the Invention

The invention relates to a semiconductor device and more particularly to a three-dimensional memory array with high density.

2. Description of Related Art

Advancements in electronic devices lead to the need for greater storage capabilities. In order to increase storage capability, the size of memory devices becomes smaller and more compact. Thus, the industry now pays high attention to three-dimensional (3D) memory arrays with high density.

FIG. 1 illustrates a schematic 3D diagram of a conventional 3D cross point memory array. A conventional 3D cross point memory array 10 includes a plurality of first electrodes 12 arranged along a first direction, a plurality of second electrode 16 arranged along a second direction, and a plurality of first memory elements 14. The second direction is perpendicular to the first direction. The second electrodes 16 are disposed above the first electrodes 12. The first memory elements 14 are disposed at cross points of the second electrodes 16 and the first electrodes 12. When a feature size of the fabrication is F, the smallest size of a memory cell in the 3D memory array is $4F^2$.

The 3D cross point memory array 10 can further include a plurality of third electrodes 20 arranged along the first direction above the second electrodes 16 and a plurality of second memory elements 18 disposed at cross points of the third electrodes 20 and the second electrodes 16. An equivalent smallest size of a memory cell in the 3D memory array is thus $2F^2$. Similarly, when the 3D memory array has N layers of memory cells stacked together, an equivalent smallest size of the memory cell is then $4F^2/N$.

Although capable of reducing the smallest size of the memory cell effectively, the conventional 3D cross point memory array fails to enhance the feasibility thereof due to the following reasons. Firstly, for every layer of memory cells stacked, at least one patterning step is required (including deposition, photolithography, etching and so on) which leads to high fabrication cost. In addition, since each layer of memory cells is formed in different patterning steps, the size and the composition thereof are not entirely identical and create variability to the characteristics of the device. Moreover, a lower memory layer (e.g. the first memory element 14) is subject to more thermal budget than an upper memory layer (e.g. the second memory element 18). Consequently, the lower memory layer has low reliability and performance.

SUMMARY OF THE INVENTION

Accordingly, the invention is directed to a three-dimensional (3D) memory array capable of solving the issues above and having a memory cell size smaller than that of the conventional 3D memory array.

The invention is directed to a 3D memory array including a plurality of word line layers disposed on a substrate, a first bit line layer, a first conductive pillar array, a second bit line layer, and a second conductive pillar array. Each of the word line layers has a plurality of word lines and a plurality of gaps arranged alternately along a first direction. The gaps include a first group of gaps and a second group of gaps arranged alternately. The first bit line layer is disposed above the word line layers and has a plurality of first bit lines arranged along a second direction. The second direction is perpendicular to the first direction. The first conductive pillar array extends through the word line layers and is electrically connected to the first bit line layer. The first conductive pillar array includes a plurality of first conductive pillars disposed in the first group of gaps. A first memory element is disposed between a first conductive pillar and a word line of the word line layer adjacent to the first conductive pillar and located to cover a bottom surface of the first conductive pillar. The second bit line layer is disposed above the first bit line layer and has a plurality of second bit lines arranged along the second direction. The first bit lines and the second bit lines are arranged alternately. The second conductive pillar array extends through the word line layers and is electrically connected to the second bit line layer. The second conductive pillar array includes a plurality of second conductive pillars disposed in the second group of gaps. A second memory element is disposed between a second conductive pillar and a word line of the word line layer adjacent to the second conductive pillar and located to cover a bottom surface of the second conductive pillar. Here, the first conductive pillars and the second conductive pillars are in a staggered arrangement.

In one embodiment of the invention, the first memory element and the second memory element are each a single layer or a multiple layer structure.

In one embodiment of the invention, the first memory element and the second memory element include the same or different materials.

In one embodiment of the invention, the first memory element and the second memory element include a dielectric material.

In one embodiment of the invention, the dielectric material includes silicon oxide, silicon nitride, silicon oxynitride, aluminum oxide, titanium oxide, hafnium oxide, or a combination thereof.

In one embodiment of the invention, the first memory element and the second memory element are each a sandwich structure including a first dielectric layer, a second dielectric layer, and a conductive layer disposed between the first dielectric layer and the second dielectric layer.

In one embodiment of the invention, the first dielectric layer and the second dielectric layer each include silicon oxide, silicon nitride, silicon oxynitride, aluminum oxide, titanium oxide, or hafnium oxide, and the conductive layer includes titanium, nickel, cobalt, or copper.

In one embodiment of the invention, each of the first memory elements is disposed surrounding the corresponding first conductive pillar and each of the second memory elements is disposed surrounding the corresponding second conductive pillar.

In one embodiment of the invention, the 3D memory array further includes an insulation layer disposed in a remaining space among the word line layers, the first bit line layer, the second bit line layer, the first conductive pillar array, and the second conductive pillar array.

In one embodiment of the invention, the smallest size of a memory cell in the 3D memory array is $2F^2$.

In light of the foregoing, since the conductive pillars of the invention are fabricated in the same patterning step (or two patterning steps at most), the memory cells formed by the conductive pillars, the memory elements, and the corresponding word lines have the same characteristics. The lower memory layer and the upper memory layer are subject to the same thermal budget, and thus the reliability and performance of the lower memory layer are not affected. Additionally, the smallest size of the memory cell in the 3D memory array of the invention can be reduced to $2F^2$ so as to increase the density of the memory device greatly.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

First Embodiment

Figure 1:
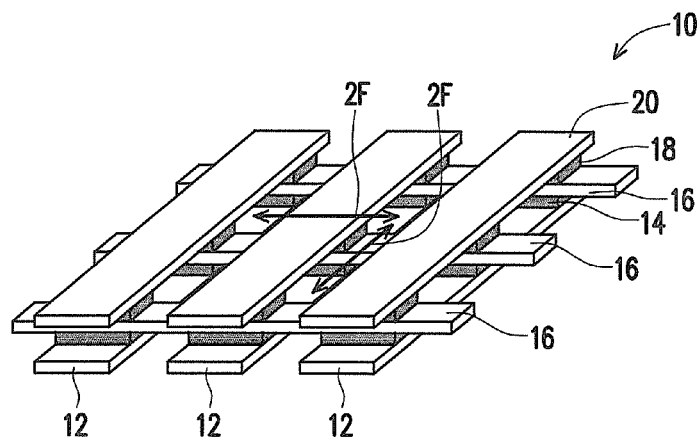
FIG. 1 illustrates a schematic three-dimensional (3D) diagram of a conventional 3D cross point memory array.
Figure 2:
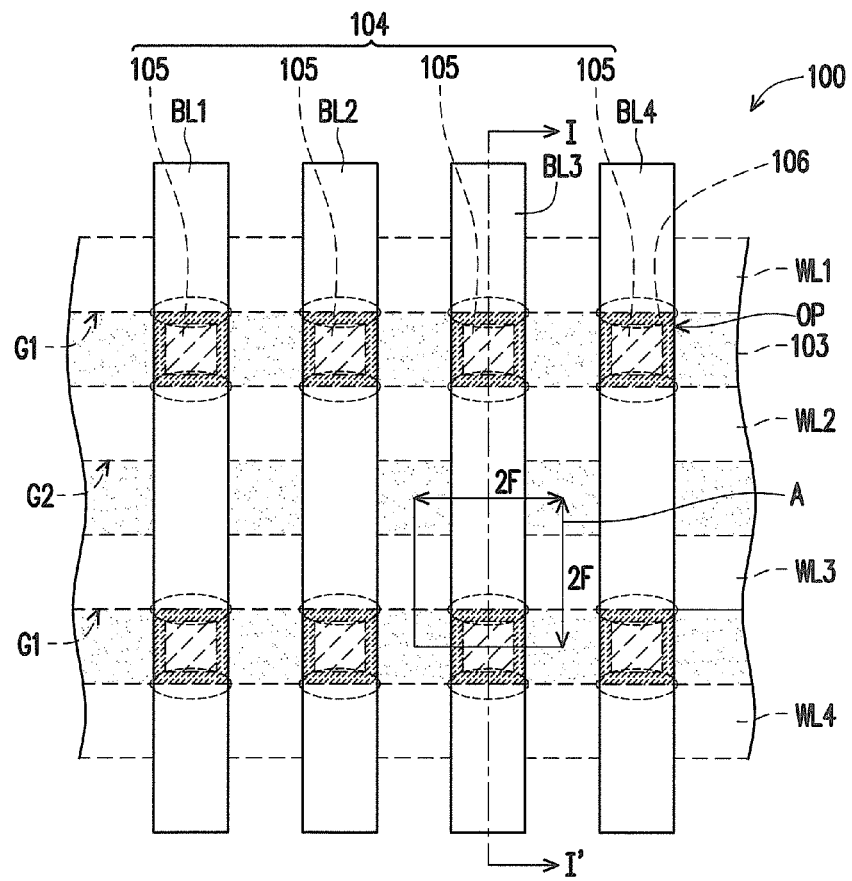
FIG. 2 illustrates a schematic top view of a 3D memory array according to a first embodiment of the invention.
Figure 3:
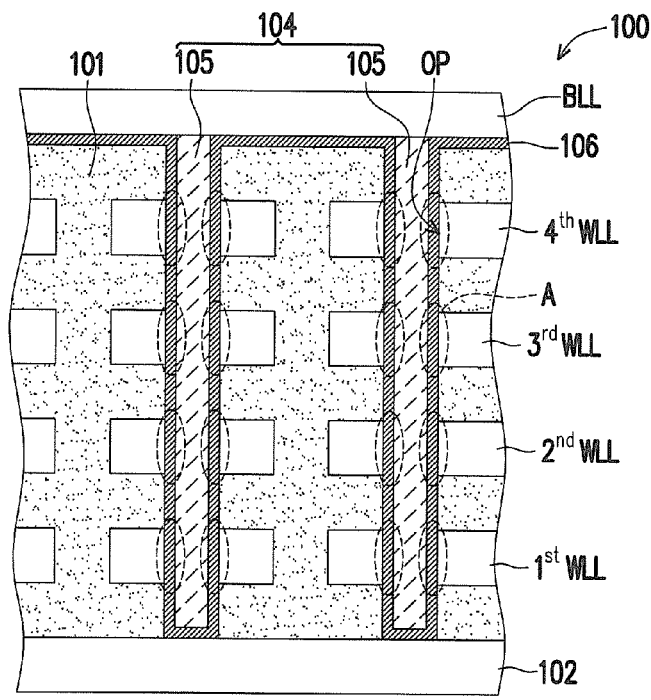
FIG. 3 is a schematic cross-sectional view taken along line I-I' in FIG. 2.
Figure 5:
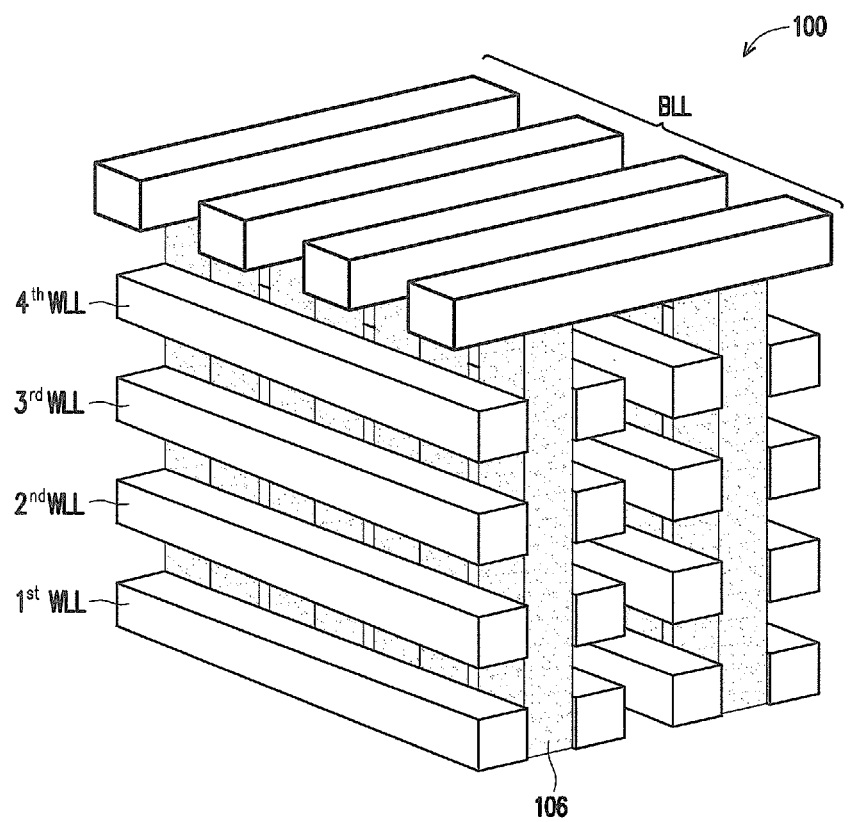
FIG. 5 illustrates a schematic 3D diagram of the 3D memory array according to the first embodiment of the invention.

FIG. 2 illustrates a schematic top view of a 3D memory array according to a first embodiment of the invention. For better illustration, an uppermost insulation layer and memory elements underneath are omitted in FIG. 2. FIG. 3 is a schematic cross-sectional view taken along line I-I' in FIG. 2. FIG. 5 illustrates a schematic 3D diagram of the 3D memory array according to the first embodiment of the invention. For better illustration, an insulation layer 101 is not depicted in FIG. 5.

Referring to FIGS. 2, 3, and 5, a 3D memory array 100 of the first embodiment includes a plurality of word line layers $1^{st}$ WLL-$4^{th}$ WLL, a bit line layer BLL, a conductive pillar array 104, a plurality of memory elements 106, and an insulation layer 101.

The word line layers $1^{st}$ WLL, $2^{nd}$ WLL, $3^{rd}$ WLL, and $4^{th}$ WLL are sequentially disposed on a substrate 102. Each of the word line layers WLL has a plurality of word lines WL1-WL4 and a plurality of gaps G arranged alternately along a first direction. The gaps G include a first group of gaps G1 and a second group of gaps G2 arranged alternately. Specifically, each of the word line layers WLL has WL1, G1, WL2, G2, WL3, G1, WL4, G2 . . . arranged sequentially along the first direction.

The bit line BLL is disposed above the word line layer $4^{th}$ WLL and has a plurality of bit lines BL1-BL4 arranged along a second direction. The second direction is perpendicular to the first direction.

The conductive pillar array 104 extends through the word line layers $1^{st}$ WLL-$4^{th}$ WLL and is electrically connected to the bit line layer BLL. The conductive pillar array 104 includes a plurality of conductive pillars 105 disposed in the first group of gaps G1. A first memory element 106 is disposed between a conductive pillar 105 and a word line WL of the word line layer WLL adjacent to the conductive pillar 105.

In one embodiment, each of the memory elements 106 is a single layer or a multiple layer structure. The memory elements 106 include a dielectric material, for example, silicon oxide, silicon nitride, silicon oxynitride, aluminum oxide, titanium oxide, hafnium oxide, or a combination thereof.

Figure 4:
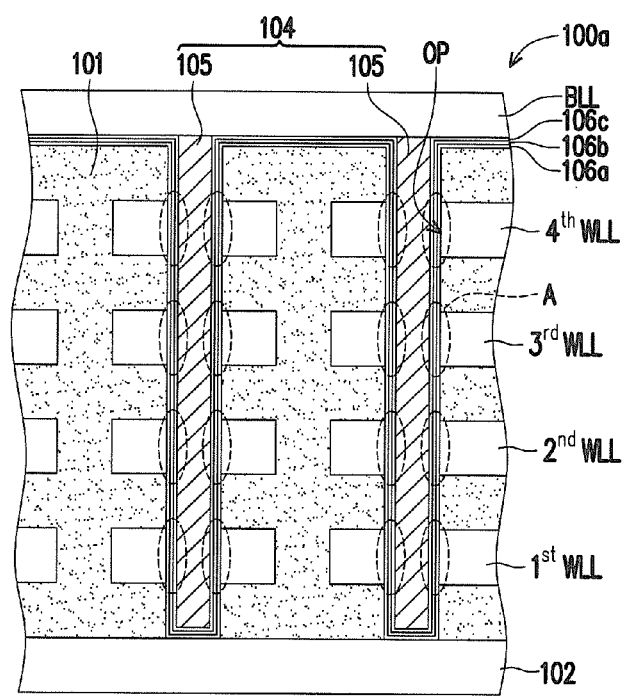
FIG. 4 illustrates a schematic top view of the 3D memory array according to the first embodiment of the invention.

In another embodiment, each of the memory elements 106 is a sandwich structure including a first dielectric layer 106a, a second dielectric layer 106c, and a conductive layer 106b disposed between the first dielectric layer 106a and the second dielectric layer 106c, so as to form a 3D memory array 100a as shown in FIG. 4. The first dielectric layer 106a and the second dielectric layer 106c each include silicon oxide, silicon nitride, silicon oxynitride, aluminum oxide, titanium oxide, or hafnium oxide. The conductive layer 106b includes titanium, nickel, cobalt, or copper.

The insulation layer 101 is disposed in a remaining space among the word line layers $1^{st}$ WLL, $2^{nd}$ WLL, $3^{rd}$ WLL, $4^{th}$ WLL, the bit line layer BLL, and the conductive pillar array 104. Specifically, the insulation layer 101 includes an insulation layer 103 and insulation material layers between word line material layers. A method of fabricating the above is illustrated in details below.

It should be noted that the memory elements 106 are disposed substantially surrounding the corresponding conductive pillars 105 and extend to be disposed at bottom surfaces of the corresponding conductive pillars 105 and between a top surface of the insulation layer 101 and the bit line layer BLL. In the first embodiment, the conductive pillars 105, the memory elements 106, and the corresponding word lines WL form two terminal memory cells A. The smallest size of the memory cell A of the 3D memory array 100 in the invention is $4F^2$ as depicted in FIG. 2.

In addition, in the embodiment aforementioned, the 3D memory array 100 having four layers of the word line layers $1^{st}$ WLL-$4^{th}$ WLL (each layer of the word line layer WLL has four word lines WL1-WL4), four bit lines BL1-BL4, and four conductive pillars 105 is illustrated herein as an example; however, the invention is not limited thereto. Those of common knowledge in the art should understand that the invention does not limit the numbers of word line layers, word lines, bit lines, and conductive pillars.

Figure 2A:
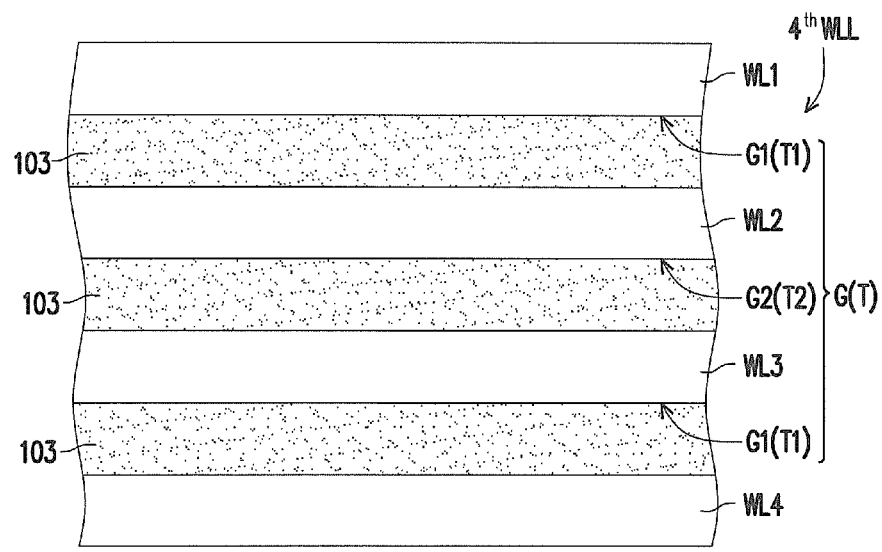
FIGS. 2A-2C illustrate schematic top views of a method of fabricating the 3D memory array according to the first embodiment of the invention.
Figure 2B:
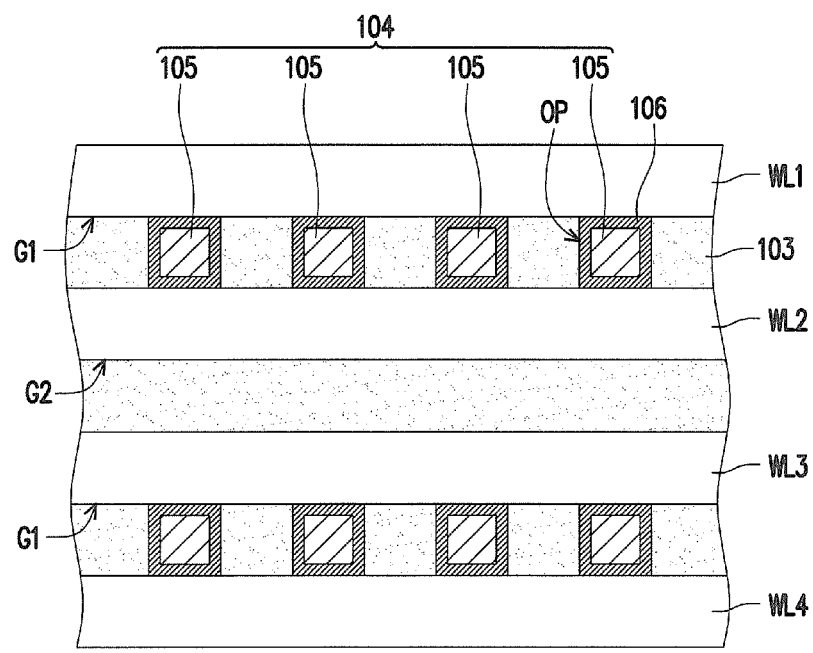
Figure 2C:
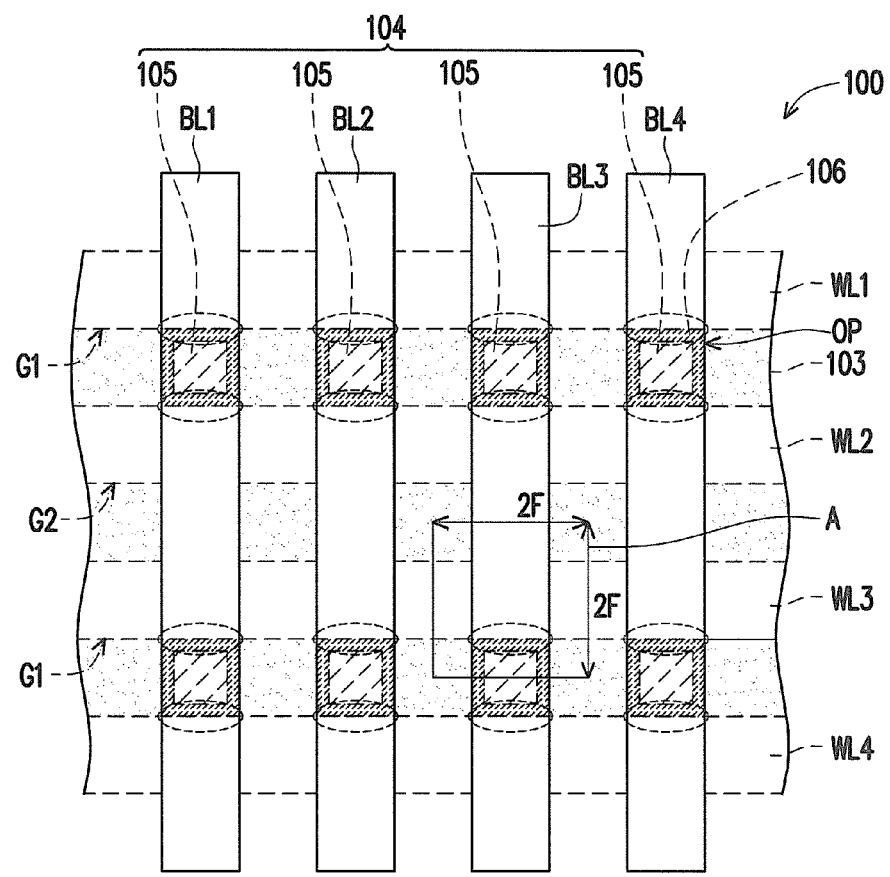

In the following, a method of fabricating the 3D memory array 100 of the first embodiment is described. FIGS. 2A-2C illustrate schematic top views of a method of fabricating the 3D memory array according to the first embodiment of the invention. For better illustration, some of the elements are omitted in some of the drawings.

Referring to FIG. 2A (the uppermost insulation layer is not shown) and FIG. 3, a plurality of word line material layers and a plurality of insulation material layers (not shown) arranged alternately are formed on a substrate 102. Thereafter, a plurality of trenches T (T1, T2) extending through the word line material layers and the insulation material layers is formed and arranged along a first direction, so as to form word line layers $1^{st}$ WLL-$4^{th}$ WLL. Each of the word line layers WLL has a plurality of word lines WL1-WL4 and a plurality of gaps G arranged alternately along the first direction. The gaps G include a first group of gaps G1 and a second group of gaps G2 arranged alternately. Specifically, each of the word line layers WLL has WL1, G1, WL2, G2, WL3, G1, WL4 . . . arranged sequentially along the first direction. The gaps G (or the trenches T) are then filled with an insulation layer 103.

Referring to FIG. 2B (the uppermost insulation layer and the memory elements underneath are not shown) and FIG. 3, a plurality of openings OP connected to the corresponding word lines WL is formed at positions corresponding to the first group of gaps G1 in the insulation layer. Subsequently, the memory elements 106 are formed on the substrate 102 to cover a plurality of surfaces (that is, bottom surfaces and sidewalls) of the openings OP and a surface of the uppermost insulation layer. The openings OP are then filled with a conductive material (e.g. tungsten) to form a conductive pillar array 104 having a plurality of conductive pillars 105.

Referring to FIG. 2C (the uppermost insulation layer and the memory elements underneath are not shown) and FIG. 3, the bit line layer BLL is formed on the substrate 102. The bit line layer BLL has a plurality of bit lines BL1-BL4 arranged along a second direction. The conductive pillar array 104 is electrically connected to the bit line layer BLL.

In the first embodiment, a plurality of conductive pillars 105 is fabricated in the same patterning step. That is, a plurality of memory cells A formed by the conductive pillars 105, the memory elements 106, and the corresponding word lines WL is fabricated in the same patterning step. The fabrication cost thereof can thus be reduced greatly to avoid the additional patterning step required for each layer of memory cells stacked in the conventional art. Further, since the memory cells A in the 3D memory array 100 of the invention are fabricated in the same patterning step, the memory cells A have identical functions. The memory cells in the bottom layer and the memory cells in the top layer are subject to the same thermal budget. Therefore, the reliability and performance of the lower memory layer are not affected.

Second Embodiment

Figure 6:
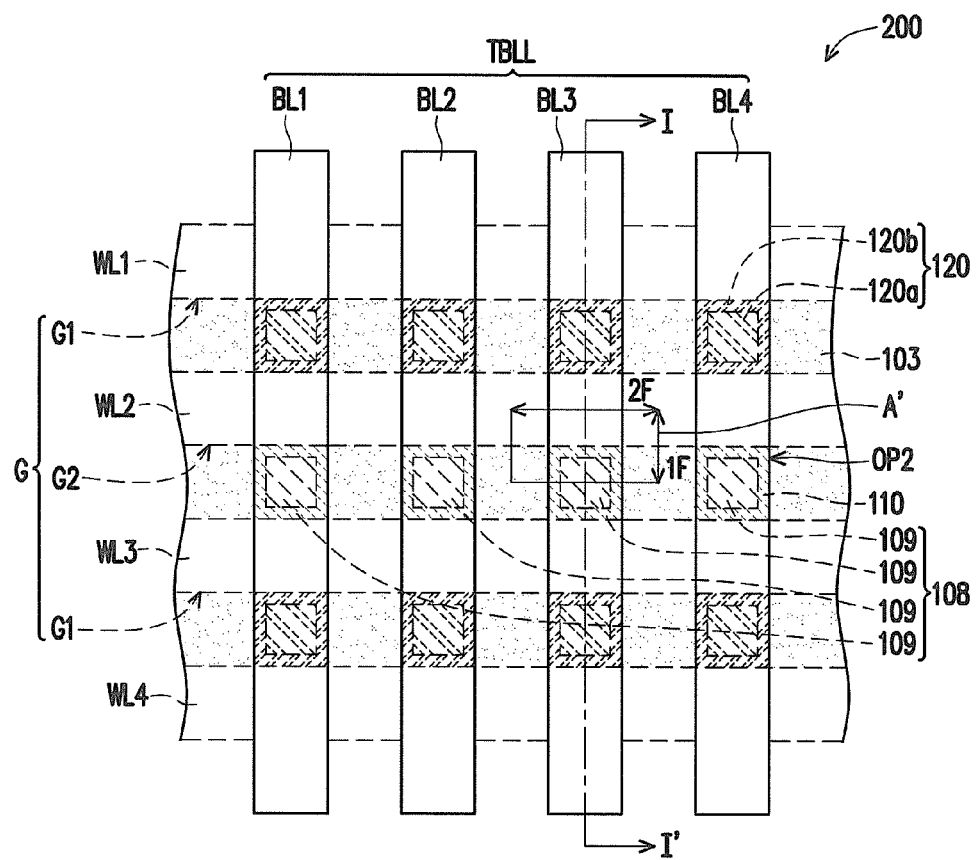
FIG. 6 illustrates a schematic top view of a 3D memory array according to a second embodiment of the invention.
Figure 7:
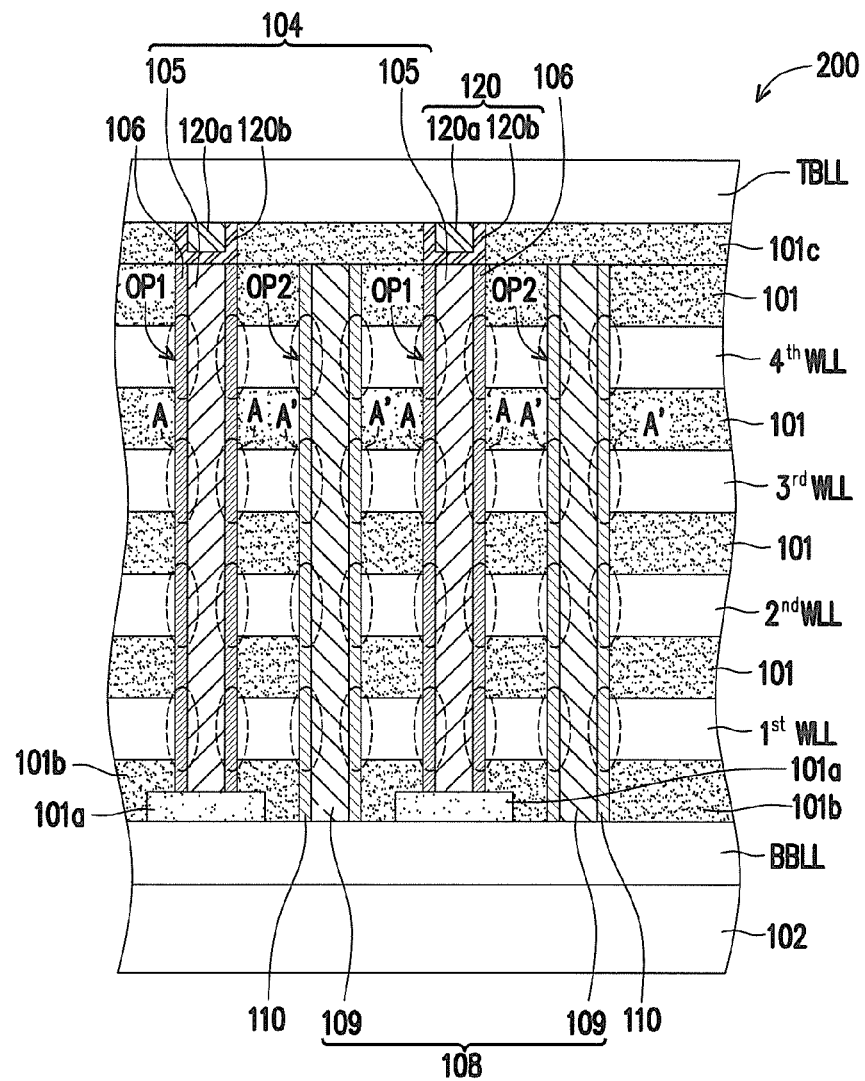
FIG. 7 is a schematic cross-sectional view taken along line I-I' in FIG. 6.
Figure 8:
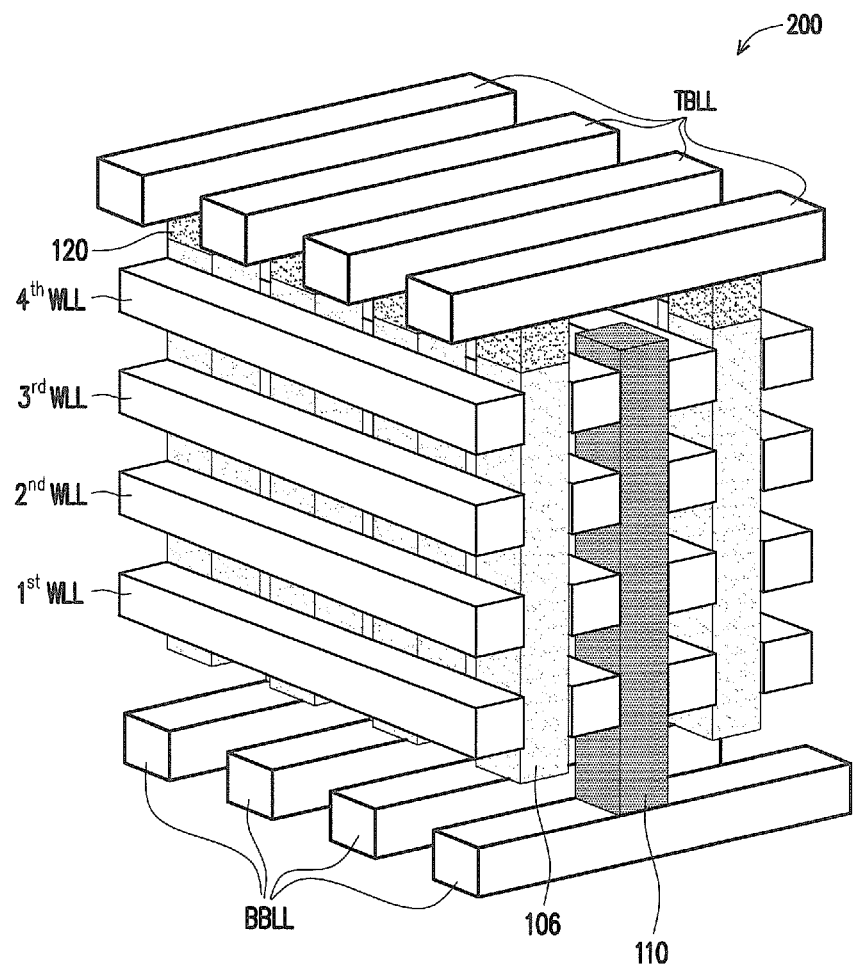
FIG. 8 illustrates a schematic 3D diagram of the 3D memory array according to the second embodiment of the invention.

FIG. 6 illustrates a schematic top view of a 3D memory array according to a second embodiment of the invention. For better illustration, an insulation layer disposed above a word line layer $4^{th}$ WLL is not shown in FIG. 6. FIG. 7 is a schematic cross-sectional view taken along line I-I' in FIG. 6. FIG. 8 illustrates a schematic 3D diagram of the 3D memory array according to the second embodiment of the invention. For better illustration, an insulation layer 101 is not depicted in FIG. 8.

Referring to FIGS. 6, 7, and 8, a 3D memory array 200 in the second embodiment includes a plurality of word line layers $1^{st}$ WLL-$4^{th}$ WLL, a bottom bit line layer BBLL, a top bit line layer TBLL, a conductive pillar array 104, memory elements 106, a conductive pillar array 108, memory elements 110, and an insulation layer 101.

The word line layers $1^{st}$ WLL, $2^{nd}$ WLL, $3^{rd}$ WLL, $4^{th}$ WLL are sequentially disposed on the substrate 102. Each of the word line layers WLL has a plurality of word lines WL1-WL4 and a plurality of gaps G arranged alternately along a first direction. The gaps G include a first group of gaps G1 and a second group of gaps G2 arranged alternately. In specific, each of the word line layers WLL has WL1, G1, WL2, G2, WL3, G1, WL4, G2 . . . arranged sequentially along the first direction.

The bottom bit line layer BBLL is disposed below the word line layer $1^{st}$ WLL and has a plurality of bit lines BL1-BL4 arranged along a second direction. The second direction is perpendicular to the first direction.

The top bit line layer TBLL is disposed above the word line layer $4^{th}$ WLL and has a plurality of bit lines BL1-BL4 arranged along the second direction.

The conductive pillar array 108 extends through the word line layers $1^{st}$ WLL-$4^{th}$ WLL and is electrically connected to the bottom bit line layer BBLL. The conductive pillar array 108 includes a plurality of conductive pillars 109 disposed in the second group of gaps G2. A memory element 110 is disposed between a conductive pillar 109 and a word line WL of the word line layer WLL adjacent to the conductive pillar 109. The conductive pillar array 104 extends through the word line layers $1^{st}$ WLL-$4^{th}$ WLL and is electrically connected to the top bit line layer TBLL. The conductive pillar array 104 includes a plurality of conductive pillars 105 disposed in the first group of gaps G1. A memory element 106 is disposed between a conductive pillar 105 and a word line WL of the word line layer WLL adjacent to the conductive pillar 105.

Additionally, the 3D memory array 200 in the second embodiment further includes a plurality of conductive plugs 120 disposed on the corresponding conductive pillars 105. Each of the conductive plugs 120 is constituted by a conductive layer 120a and a barrier layer 120b surrounding a sidewall and a bottom of the conductive layer 120a, for example. A material of the conductive layer 120a is, for example, tungsten, and a material of the barrier layer 120b is, for instance, titanium nitride. The conductive pillar array 104 is electrically connected to the top bit line layer TBLL substantially through the conductive plugs 120.

In an embodiment, the memory elements 110 and the memory elements 106 are each a single layer or a multiple layer structure. The memory elements 110 and the memory elements 106 include a dielectric material, for example, silicon oxide, silicon nitride, silicon oxynitride, aluminum oxide, titanium oxide, hafnium oxide, or a combination thereof.

The insulation layer 101 is disposed in a remaining space among the word line layers $1^{st}$ WLL-$4^{th}$ WLL, the bottom bit line layer BBLL, the top bit line layer TBLL, the conductive pillar array 108, and the conductive pillar array 104. Specifically, the insulation layer 101 includes an insulation layer 103, patterns 101a of a patterned etch stop layer, an insulation layer 101b, an insulation layer 101c, and insulation material layers between word line material layers. The aforementioned is then described in details in the following.

It should be noted that the memory elements 110 are disposed substantially surrounding the corresponding conductive pillars 109. Similarly, the memory elements 106 are disposed substantially surrounding the corresponding conductive pillars 105. In the second embodiment, the conductive pillars 109, the memory elements 110, and the corresponding word lines WL form two terminal memory cells A', and the conductive pillars 105, the memory elements 106, and the corresponding word lines WL form two terminal memory cells A.

Since the memory element 110 and the memory element 106 are designed to include the same material, and the conductive pillar 109 and the conductive pillar 105 are designed to include the same material, the memory cell A and the memory cell A' can be completely identical. The smallest size of each memory cell A (or A') in the 3D memory array 200 of the invention is $2F^2$, as shown in FIG. 6.

A method of fabricating the 3D memory array 200 of the second embodiment is illustrated in the following. FIGS. 6A-6D show schematic top views of a method of fabricating the 3D memory array according to the second embodiment of the invention. For better illustration, some of the elements are omitted in some of the drawings.

Figure 6A:
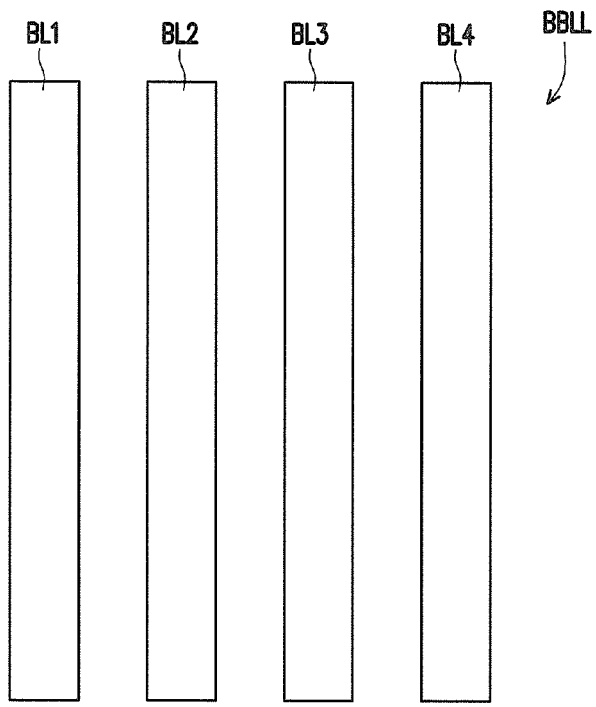
FIGS. 6A-6D show schematic top views of a method of fabricating the 3D memory array according to the second embodiment of the invention.

Referring to FIGS. 6A and 7, a bottom bit line layer BBLL is formed on a substrate 102. The bottom bit line layer BBLL has a plurality of bit lines BL1-BL4 arranged along a second direction.

Figure 6B:
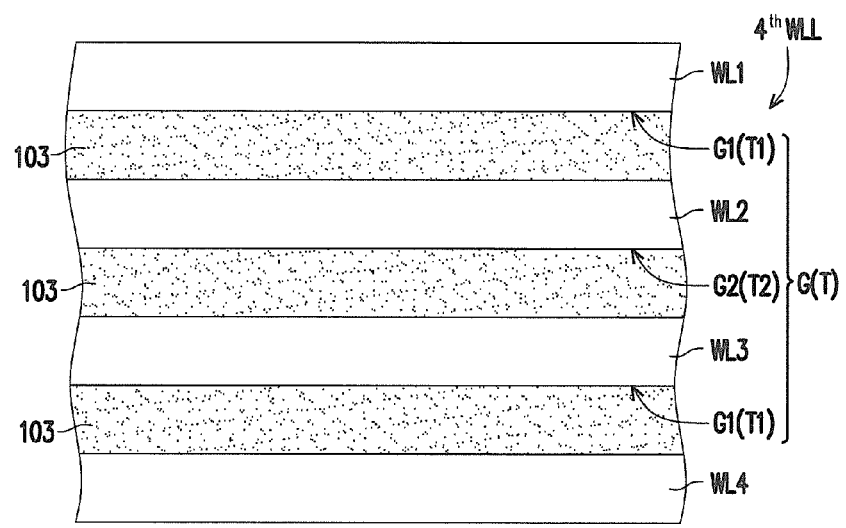

Referring to FIG. 6B (the insulation layer above the word line layer $4^{th}$ WLL is not shown) and FIG. 7, a patterned etch stop layer is formed on the bottom bit line layer BBLL. The patterned etch stop layer has a plurality of patterns 101a arranged along a first direction to expose a portion of the bottom bit line layer BBLL. Thereafter, an insulation layer 101b is formed on the patterned etch stop layer to fill the gaps between the patterns 101a in the patterned etch stop layer. A material of the patterned etch stop layer has etching selectivity with respect to a material of the insulation layer 101b. For instance, a material of the patterned etch stop layer is, for example, silicon nitride, and a material of the insulation layer 101b is, for example, silicon oxide.

Subsequently, a plurality of word line material layers and a plurality of insulation material layers (not shown) arranged alternately are formed on the insulation layer 101b. Afterwards, a plurality of trenches T (T1, T2) extending through the word line material layers and the insulation material layers is formed and arranged along the first direction, so as to form word line layers $1^{st}$ WLL-$4^{th}$ WLL. Each of the word line layers WLL has a plurality of word lines WL1-WL4 and a plurality of gaps G arranged alternately along the first direction. The gaps G include a first group of gaps G1 and a second group of gaps G2 arranged alternately. In specific, each of the word line layers WLL has WL1, G1, WL2, G2, WL3, G1, WL4, G2 . . . arranged sequentially along the first direction. Thereafter, the gaps G (or the trenches T) are filled with an insulation layer 103.

Figure 6C:
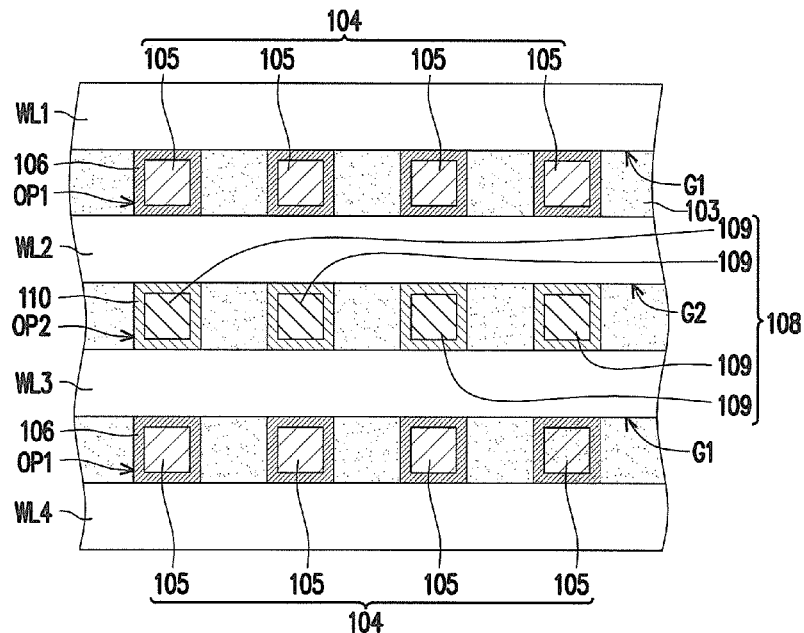

Referring to FIG. 6C (the insulation layer above the word line layer $4^{th}$ WLL is not shown) and FIG. 7, a plurality of openings OP1 connected to the corresponding word lines WL is formed at positions corresponding to the first group of gaps G1 in the insulation layer and a plurality of openings OP2 connected to the corresponding word lines WL is formed at positions corresponding to the second group of gaps G2. Notably, the openings OP2 correspond to the gaps between the patterns 101a in the patterned etch stop layer, and the openings OP1 correspond to the patterns 101a in the patterned etch stop layer. In other words, since a material of the patterned etch stop layer has etching selectivity with respect to a material of the insulation layer 101b, an etching process for forming the openings OP2 stops on the bottom bit line layer BBLL while the same etching process for forming the openings OP1 stops on the patterns 101a of the patterned etch stop layer as displayed in FIG. 7.

Subsequently, a memory layer is formed on the substrate 102 to cover surfaces (that is, bottom surfaces and sidewalls) of the openings OP1 and OP2 and a surface of the uppermost insulation layer. The bottom surfaces of the openings OP1 and OP2 and the memory layer on the uppermost insulation layer are removed, so as to form memory elements 106 on the sidewalls of the openings OP1 and memory elements 110 on the sidewalls of the openings OP2.

Later, the openings OP1 and OP2 are filled with a conductive material (e.g. tungsten) to form a conductive pillar array 104 having a plurality of conductive pillars 105 and a conductive pillar array 108 having a plurality of conductive pillars 109. The conductive pillar array 108 is electrically connected to the bottom bit line layer BBLL.

Figure 6D:
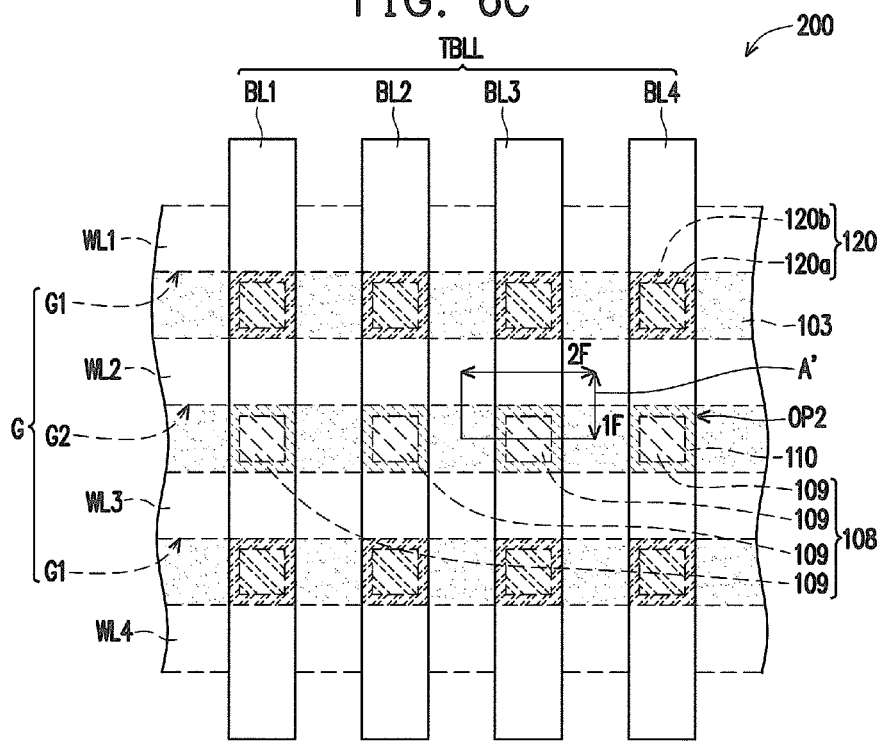

Referring to FIG. 6D (the insulation layer above the word line layer $4^{th}$ WLL is not shown) and FIG. 7, an insulation layer 101c is formed on the substrate 102. The conductive plugs 120 corresponding to the conductive pillars 105 are then formed in the insulation layer 101c. Each of the conductive plugs 120 is constituted by a conductive layer 120a and a barrier layer 120b surrounding a sidewall and a bottom of the conductive layer 120a, for example. A material of the conductive layer 120a is, for example, tungsten, and a material of the barrier layer 120b is, for instance, titanium nitride.

Afterwards, a top bit line layer TBLL is formed on the substrate 102. The top bit line layer TBLL has a plurality of bit lines BL1-BL4 arranged along the second direction. The conductive pillar array 104 is electrically connected to the top bit line layer TBLL substantially through the conductive plugs 120.

In the second embodiment, since the conductive pillars 105 and the conductive pillars 109 are fabricated in the same patterning step, the memory cells A formed by the conductive pillars 105, the memory elements 106, and the corresponding word lines WL and the memory cells A' formed by the conductive pillars 109, the memory elements 110, and the corresponding word lines WL have the same functions. The memory cells in the bottom layer and the memory cells in the top layer are subject to the same thermal budget, so that the reliability and performance of the lower memory layer are not affected.

Third Embodiment

Figure 9:
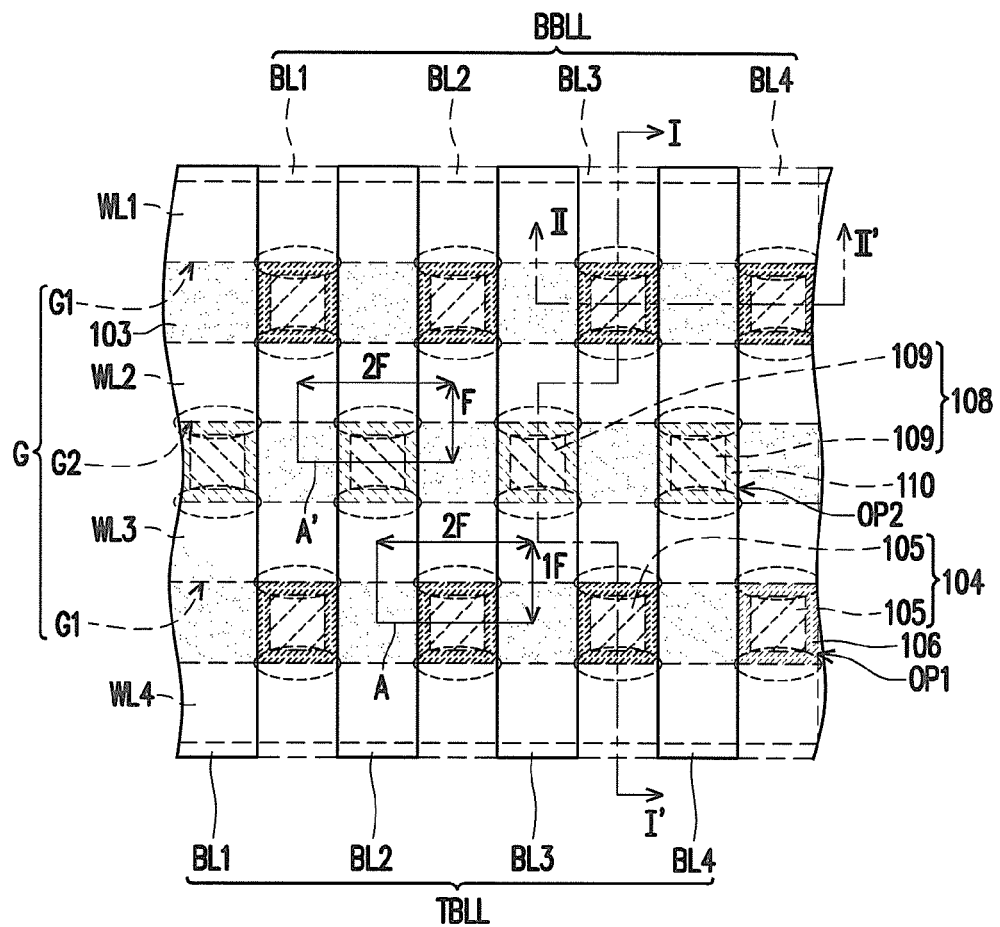
FIG. 9 illustrates a schematic top view of a 3D memory array according to a third embodiment of the invention.
Figure 10:
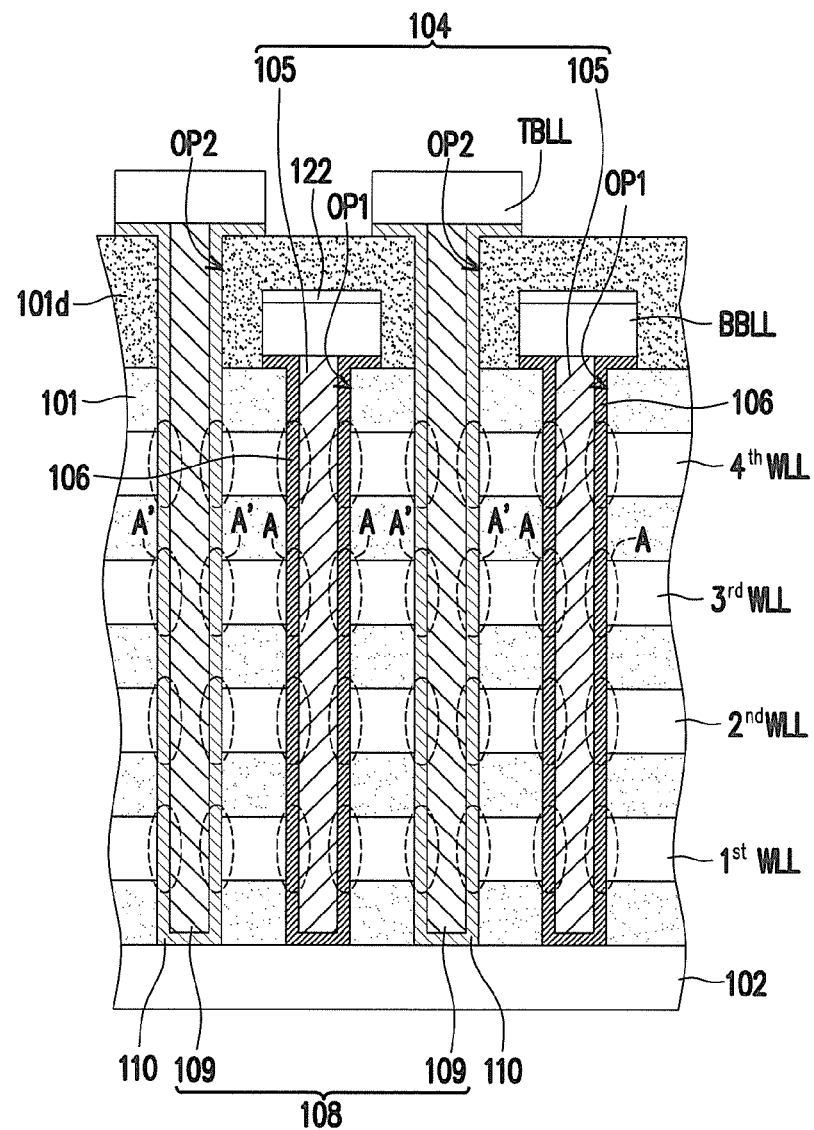
FIG. 10 is a schematic cross-sectional view taken along line I-I' in FIG. 9.
Figure 11:
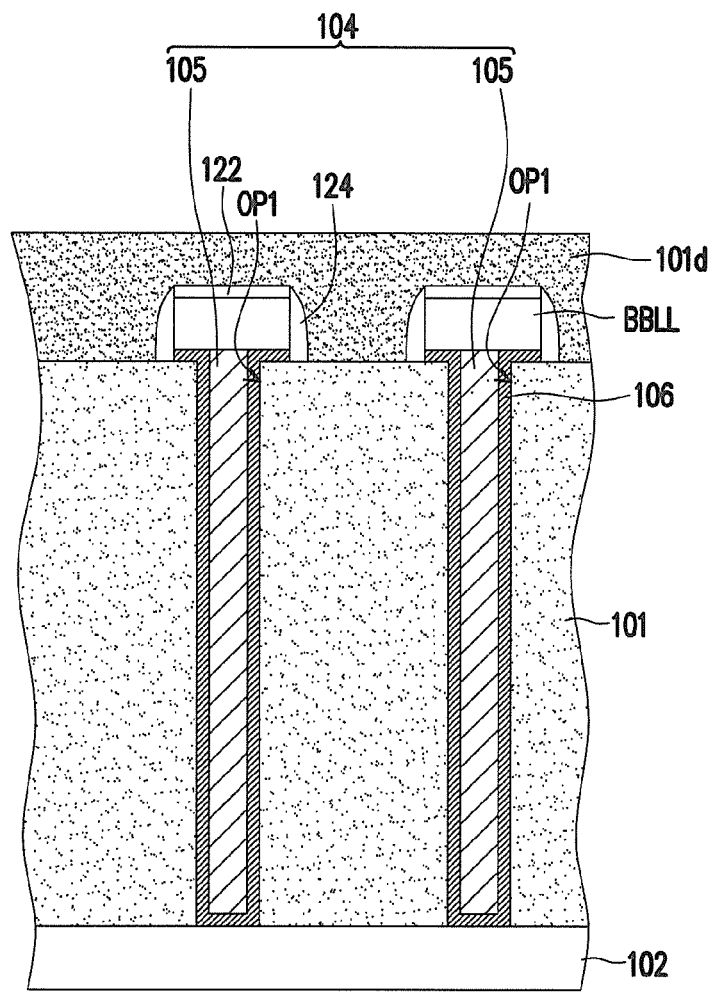
FIG. 11 is a schematic cross-sectional view taken along line II-II' in FIG. 9.
Figure 12:
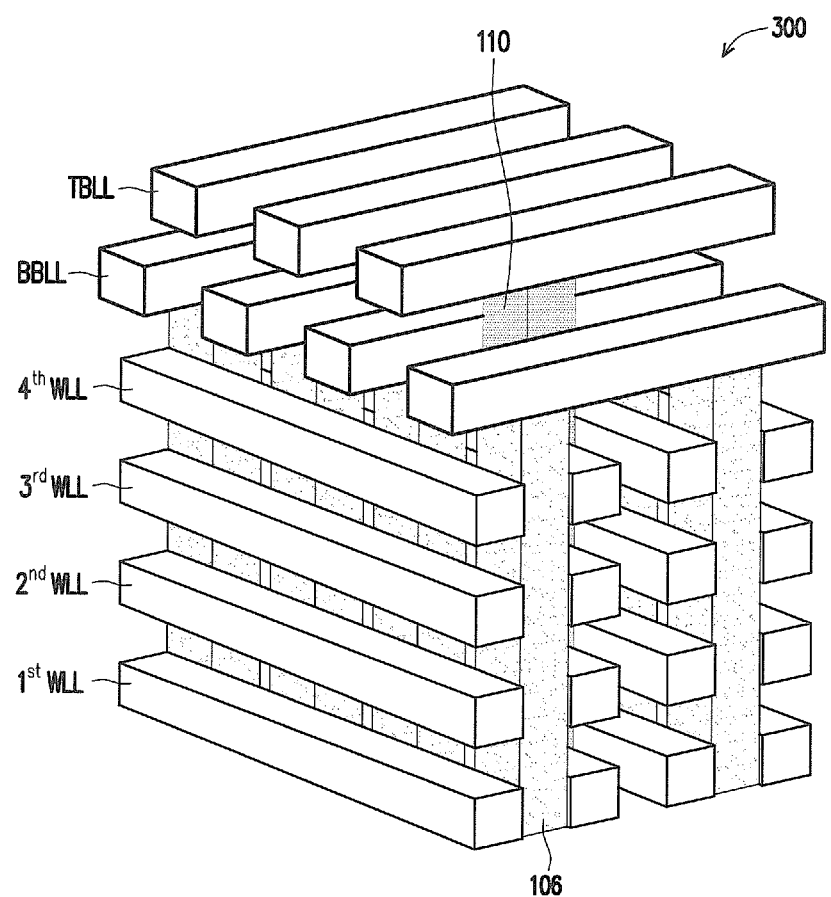
FIG. 12 illustrates a schematic 3D diagram of the 3D memory array according to the third embodiment of the invention.

FIG. 9 illustrates a schematic top view of a 3D memory array according to a third embodiment of the invention. For better illustration, elements such as insulation layers between a word line layer $4^{th}$ WLL, a bottom bit line layer BBLL, and a top bit line layer TBLL are omitted in FIG. 9. FIG. 10 is a schematic cross-sectional view taken along line I-I' in FIG. 9. FIG. 11 is a schematic cross-sectional view taken along line II-II' in FIG. 9. FIG. 12 illustrates a schematic 3D diagram of the 3D memory array according to the third embodiment of the invention. For better illustration, an insulation layer 101 is not depicted in FIG. 12.

Referring to FIGS. 9, 10, 11 and 12, a 3D memory array 300 in the invention includes a plurality of word line layers $1^{st}$ WLL-$4^{th}$ WLL, a bottom bit line layer BBLL, a top bit line layer TBLL, a conductive pillar array 104, memory elements 106, a conductive pillar array 108, memory elements 110, and an insulation layer 101.

The word line layers $1^{st}$ WLL, $2^{nd}$ WLL, $3^{rd}$ WLL, $4^{th}$ WLL are sequentially disposed on the substrate 102. Each of the word line layers WLL has a plurality of word lines WL1-WL4 and a plurality of gaps G arranged alternately along a first direction. The gaps G include a first group of gaps G1 and a second group of gaps G2 arranged alternately. In specific, each of the word line layers WLL has WL1, G1, WL2, G2, WL3, G1, WL4, G2 . . . arranged sequentially along the first direction.

The bottom bit line layer BBLL is disposed above the word line layer 4$^{th}$ WLL and has a plurality of bit lines BL1-BL4 arranged along a second direction. The second direction is perpendicular to the first direction.

The top bit line layer TBLL is disposed above the bottom bit line layer BBLL and has a plurality of bit lines BL1-BL4 arranged along the second direction.

The conductive pillar array 104 extends through the word line layers 1$^{st}$ WLL-4$^{th}$ WLL and is electrically connected to the bottom bit line layer BBLL. The conductive pillar array 104 includes a plurality of conductive pillars 105 disposed in the first group of gaps G1. A memory element 106 is disposed between a conductive pillar 105 and a word line WL of the word line layer WLL adjacent to the conductive pillar 105.

The conductive pillar array 108 extends through the word line layers 1$^{st}$ WLL-4$^{th}$ WLL and is electrically connected to the top bit line layer TBLL. The conductive pillar array 108 includes a plurality of conductive pillars 109 disposed in the second group of gaps G2. A memory element 110 is disposed between a conductive pillar 109 and a word line WL of the word line layer WLL adjacent to the conductive pillar 110. It should be noted that the conductive pillars 105 and the conductive pillars 109 are in a staggered arrangement.

In an embodiment, the memory elements 106 and the memory elements 110 are each a single layer or a multiple layer structure. The memory elements 106 and the memory elements 110 include a dielectric material, for example, silicon oxide, silicon nitride, silicon oxynitride, aluminum oxide, titanium oxide, hafnium oxide, or a combination thereof.

In another embodiment, the memory elements 106 and the memory elements 110 are each a sandwich structure (not shown) including a first dielectric layer, a second dielectric layer, and a conductive layer disposed between the first dielectric layer and the second dielectric layer. The first dielectric layer and the second dielectric layer each include silicon oxide, silicon nitride, silicon oxynitride, aluminum oxide, titanium oxide, or hafnium oxide, and the conductive layer includes titanium, nickel, cobalt, or copper.

The insulation layer 101 is disposed in a remaining space among the word line layers 1$^{st}$ WLL-4$^{th}$ WLL, the bottom bit line layer BBLL, the top bit line layer TBLL, the conductive pillar array 104, and the conductive pillar array 108. Specifically, the insulation layer 101 includes an insulation layer 103, an insulating layer 101d and insulation material layers between word line material layers. A method of fabricating the above is illustrated in details below.

It should be noted that the memory elements 106 are disposed substantially surrounding the corresponding conductive pillars 105. Similarly, the memory elements 110 are disposed substantially surrounding the corresponding conductive pillars 109. In the third embodiment, the conductive pillars 105, the memory elements 106, and the corresponding word lines WL form two terminal memory cells A, and the conductive pillars 109, the memory elements 110, and the corresponding word lines WL form two terminal memory cells A'.

Since the memory elements 106 and the memory elements 110 are designed to include the same material, and the conductive pillar 105 and the conductive pillar 109 are designed to include the same material, the memory cells A and the memory cells A' can be completely identical. The smallest size of each memory cell A (or A') in the 3D memory array 300 of the invention is 2F$^2$, as shown in FIG. 9. Obviously, the memory elements 106 and the memory elements 110 can also be designed to have different materials.

Figure 9A:
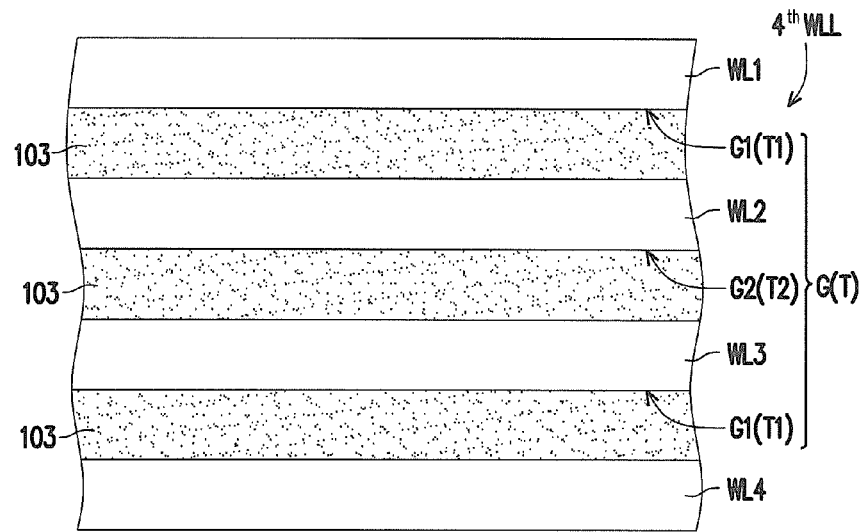
FIGS. 9A-9C show schematic top views of a method of fabricating the 3D memory array according to the third embodiment of the invention.
Figure 9B:
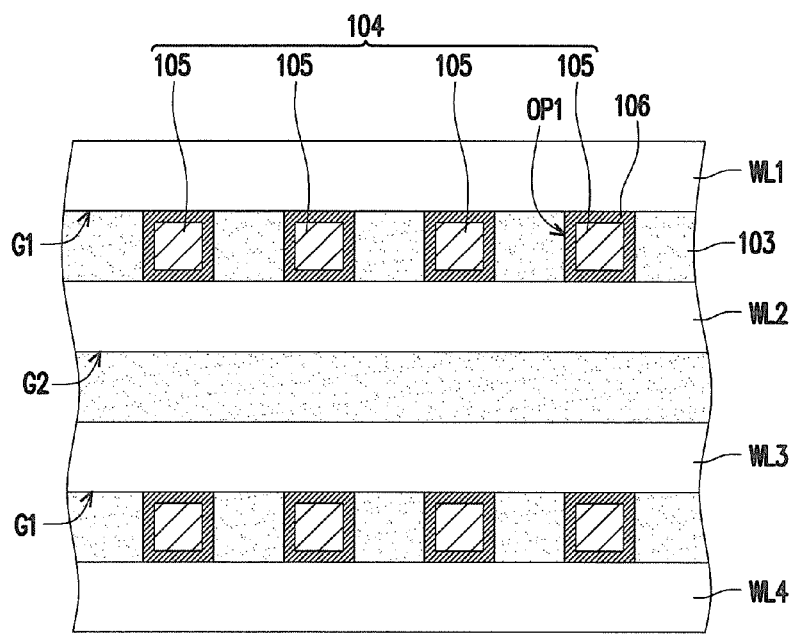
Figure 9C:
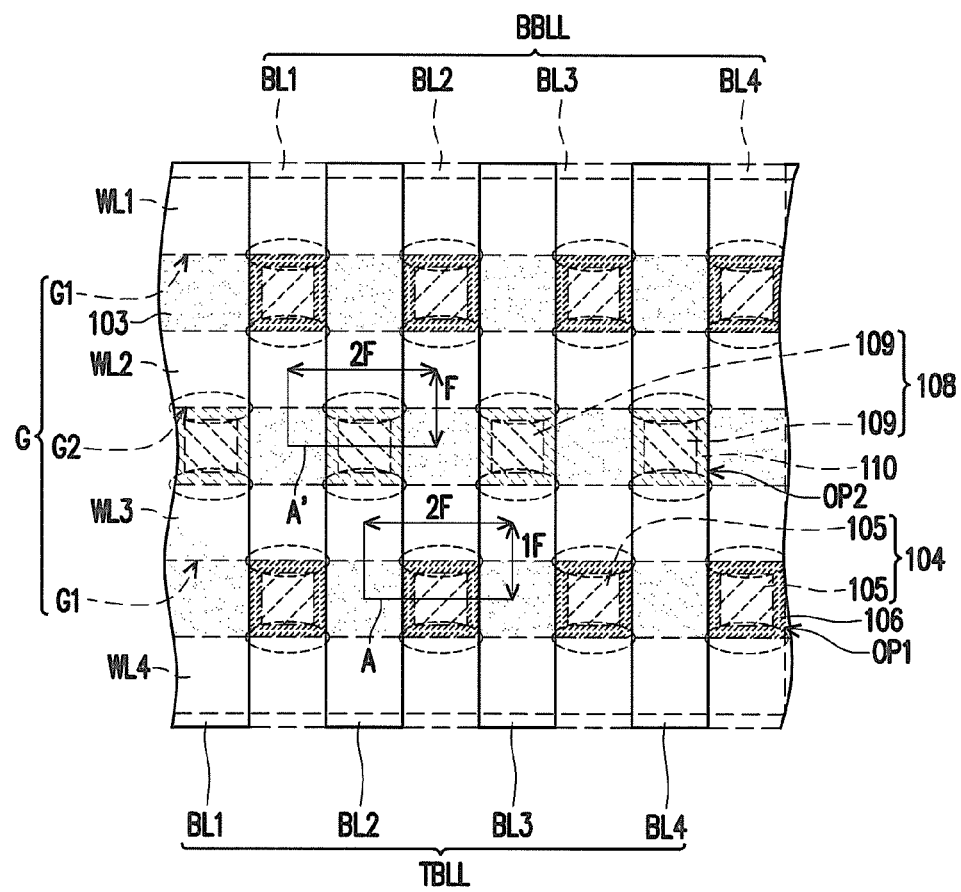

A method of fabricating the 3D memory array 300 of the third embodiment is illustrated in the following. FIGS. 9A-9C show schematic top views of a method of fabricating the 3D memory array according to the third embodiment of the invention. For better illustration, some of the elements are omitted in some of the drawings.

Referring to FIG. 9A (the uppermost insulation layer is not shown) and FIG. 10, a plurality of word line material layers and a plurality of insulation material layers (not shown) arranged alternately are formed on a substrate 102. Afterwards, a plurality of trenches T (T1, T2) extending through the word line material layers and the insulation material layers is formed and arranged along a first direction to form word line layers 1$^{st}$WLL-4$^{th}$ WLL. Each of the word line layers WLL has a plurality of word lines WL1-WL4 and a plurality of gaps G arranged alternately along the first direction. The gaps G include a first group of gaps G1 and a second group of gaps G2 arranged alternately. In specific, each of the word line layers WLL has WL1, G1, WL2, G2, WL3, G1, WL4 . . . arranged sequentially along the first direction. Thereafter, the gaps G (or the trenches T) are filled with an insulation layer 103.

Referring to FIG. 9B (the uppermost insulation layer and the memory elements underneath are not shown) and FIG. 10, a plurality of openings OP1 connected to the corresponding word lines WL is fruited at positions corresponding to the first group of gaps G1 in the insulation layer. Subsequently, memory elements 106 are formed on the substrate 102 to cover surfaces (that is, bottom surfaces and sidewalls) of the openings OP1 and a surface of the uppermost insulation layer. The openings OP1 are then filled with a conductive material (e.g. tungsten), so as to form a conductive pillar array 104 having a plurality of conductive pillars 105.

Referring to FIG. 9C (elements such as insulation layers between the word line layer 4$^{th}$ WLL, the bottom bit line layer BBLL and the top bit line layer TBLL are not shown) and FIG. 10, a bottom bit line layer BBLL is formed on the substrate 102. The bottom bit line layer BBLL has a plurality of bit lines BL1-BL4 arranged along a second direction. The conductive pillar array 104 is electrically connected to the bottom bit line layer BBLL.

In an embodiment, a method of forming the bottom bit line layer BBLL includes the following steps. A bottom bit line material layer (not shown) and silicon nitride patterns 122 are sequentially formed on the substrate 102. Thereafter, the silicon nitride patterns 122 are adopted as an etching mask for patterning the bottom bit line material layer. Therefore, the bit lines BL1-BL4 of the formed bottom bit line layer BBLL have the silicon nitride patterns 122 disposed thereon. Silicon nitride spacers 124 are formed on the sidewalls of the bit lines BL1-BL4 of the bottom bit line layer BBLL. Specifically, the top surfaces and the sidewalls of each of the bit lines BL1-BL4 of the bottom bit line layer BBLL are protected by the silicon nitride layer as shown in the cross-sectional view taken along line II-II' in FIG. 11.

Afterwards, an insulation layer 101d (e.g. the silicon oxide layer) is formed on the substrate 102 to cover the bottom bit line layer BBLL.

Referring to FIGS. 9C and 10, a plurality of openings OP2 connected to the corresponding word lines WL is formed at positions corresponding to the second group of gaps G2 in the insulation layer. The top surfaces and the sidewalls of each of the bit lines BL1-BL4 of the bottom bit line layer BBLL are protected by the silicon nitride layer, and the silicon nitride layer has etching selectivity with respect to the silicon oxide layer, so that an etching process for forming the openings OP2 does not damage the bit lines BL1-BL4 of the bottom bit line layer BBLL, and short circuits between the top bit lines and the bottom bit lines are not observed. Notably, the openings OP1 and the openings OP2 are in a staggered arrangement.

Subsequently, the memory elements 110 are formed on the substrate 102 to cover surfaces (that is, bottom surfaces and sidewalls) of the openings OP2 and a surface of the insulation layer 101d. The openings OP2 are then filled with a conductive material (e.g. tungsten) to form a conductive pillar array 108 having a plurality of conductive pillars 109.

Referring to FIGS. 9C and 10, a top bit line layer TBLL is formed on the substrate 102 afterwards. The top bit line layer TBLL has a plurality of bit lines BL1-BL4 arranged along the second direction. The conductive pillar array 108 is electrically connected to the top bit line layer TBLL.

In the third embodiment, a plurality of conductive pillars 105 is fabricated in the same patterning step and a plurality of conductive pillars 109 is fabricated in another patterning step. In other words, the memory cells A formed by the conductive pillars 105, the memory elements 106, and the corresponding word lines WL can have the same functions. Similarly, the two terminal memory cells A' formed by the conductive pillars 109, the memory elements 110, and the corresponding word lines WL can have the same functions.

In summary, since the conductive pillars of the invention are fabricated in the same patterning step (or two patterning steps at most), the memory cells formed by the conductive pillars, the memory elements, and the corresponding word lines have the same functions. The memory cells in the lower layer and the memory cells in the upper layer are subject to the same thermal budget, so that the reliability and performance of the lower memory layer are not affected. Furthermore, the smallest size of each memory cell in the 3D memory array of the invention can be reduced to $2F^2$, such that the density of the memory device can be greatly increased.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A three-dimensional memory array, comprising:
a plurality of word line layers disposed on a substrate, each of the word line layers having a plurality of word lines and a plurality of gaps arranged alternately along a first direction, the gaps comprising a first group of gaps and a second group of gaps arranged alternately;
a first bit line layer, disposed above the word line layers and having a plurality of first bit lines arranged along a second direction, the second direction being perpendicular to the first direction;
a first conductive pillar array, extending through the word line layers and electrically connected to the first bit line layer, the first conductive pillar array comprising a plurality of first conductive pillars disposed in the first group of gaps, wherein a first memory element is disposed between a first conductive pillar and a word line of the word line layer adjacent to the first conductive pillar and wherein the first memory elements are separated from each other and respectively cover bottom surfaces of the first conductive pillars;
a second bit line layer, disposed above the first bit line layer and having a plurality of second bit lines arranged along the second direction, wherein the first bit lines and the second bit lines are arranged alternately; and
a second conductive pillar array, extending through the word line layers and electrically connected to the second bit line layer, the second conductive pillar array comprising a plurality of second conductive pillars disposed in the second group of gaps, wherein a second memory element is disposed between a second conductive pillar and a word line of the word line layer adjacent to the second conductive pillar and wherein the second memory elements are separated from each other and respectively cover bottom surfaces of the second conductive pillars, and the first conductive pillars and the second conductive pillars are in a staggered arrangement.

2. The three-dimensional memory array as claimed in claim 1, wherein the first memory element and the second memory element are each a single layer or a multiple layer structure.

3. The three-dimensional memory array as claimed in claim 1, wherein the first memory element and the second memory element comprise the same or different materials.

4. The three-dimensional memory array as claimed in claim 1, wherein the first memory element and the second memory element comprise a dielectric material.

5. The three-dimensional memory array as claimed in claim 4, wherein the dielectric material comprises silicon oxide, silicon nitride, silicon oxynitride, aluminum oxide, titanium oxide, hafnium oxide, or a combination thereof.

6. The three-dimensional memory array as claimed in claim 1, wherein the first memory element and the second memory element are each a sandwich structure comprising a first dielectric layer, a second dielectric layer, and a conductive layer disposed between the first dielectric layer and the second dielectric layer.

7. The three-dimensional memory array as claimed in claim 6, wherein the first dielectric layer and the second dielectric layer each comprise silicon oxide, silicon nitride, silicon oxynitride, aluminum oxide, titanium oxide, or hafnium oxide, and the conductive layer comprises titanium, nickel, cobalt, or copper.

8. The three-dimensional memory array as claimed in claim 1, wherein each of the first memory elements is disposed surrounding the corresponding first conductive pillar and each of the second memory elements is disposed surrounding the corresponding second conductive pillar.

9. The three-dimensional memory array as claimed in claim 1, further comprising an insulation layer disposed in a remaining space among the word line layers, the first bit line layer, the second bit line layer, the first conductive pillar array, and the second conductive pillar array.

10. The three-dimensional memory array as claimed in claim 1, wherein a smallest size of a memory cell in the three-dimensional memory array is $2F^2$.

* * * * *